United States Patent [19]

Jensen

[11] 4,164,734
[45] Aug. 14, 1979

[54] CHARGE TRANSFER MULTIPLYING FEEDBACK A/D CONVERTER

[75] Inventor: William E. Jensen, San Pedro, Calif.
[73] Assignee: Hughes Aircraft Company, Culver City, Calif.
[21] Appl. No.: 918,993
[22] Filed: Jun. 26, 1978
[51] Int. Cl.$^2$ ............................................. H03K 13/02
[52] U.S. Cl. ............................ 340/347 AD; 324/57 R
[58] Field of Search ... 340/347 AD, 347 M, 347 MT; 324/57; 307/221 D

[56] References Cited

U.S. PATENT DOCUMENTS

| | | | |
|---|---|---|---|
| 3,745,555 | 7/1973 | Carbrey | 340/347 AD |
| 3,842,413 | 10/1974 | Lagarde | 340/347 AD |
| 3,930,255 | 12/1975 | Means | 340/347 AD |
| 4,065,766 | 12/1977 | Butler | 340/347 AD |
| 4,072,938 | 2/1978 | Buchanan | 340/347 AD |
| 4,087,812 | 5/1978 | Terman | 340/347 AD |
| 4,115,766 | 9/1978 | Smith | 340/347 AD |

OTHER PUBLICATIONS

Mok, "Solid-State Electronics", 1974, vol. 17, pp. 1147-1154.

*Primary Examiner*—Charles D. Miller
*Attorney, Agent, or Firm*—Martin E. Gerry; W. H. MacAllister

[57] ABSTRACT

A charge transfer multiplying feedback A/D converter is provided wherein a CCD component is part of the converter and feeding a source follower and a comparator to provide a charge feedback path into the CCD converter and also to provide a resetting signal to a primary charge storage well within the CCD component. The primary charge storage well has a charge capacity corresponding to one-half of the full scale value of the converter. A charge applied to the converter is indicative of the instantaneous value of an analog input signal to the primary charge storage well. A secondary charge storage well is also provided for temporarily storing excess charges which overflow from the primary charge storage area into such secondary storage well. The converter has built into it a mechanism for sensing the amount of charge stored in the secondary charge storage well and for periodically creating an amount of charge, that is proportional to twice the sensed charge, for transferring same to the primary charge storage well. This converter also has a mechanism for changing a potential barrier level so as to enable the draining of the charge stored in the secondary charge storage well. The CCD component determines whether or not the charge applied to the primary charge storage well exceeds its charge storage capacity. The converter has the ability of draining the charge from the primary charge storage well when overflow charges are sensed and for transferring the charge stored in such primary charge storage well to the secondary charge storage well when overflow charges are not sensed. The converter also includes multiplication capability of charge by way of a feedback loop between an output terminal of the sensed digital signal back to an input gate into the primary charge storage well.

11 Claims, 11 Drawing Figures

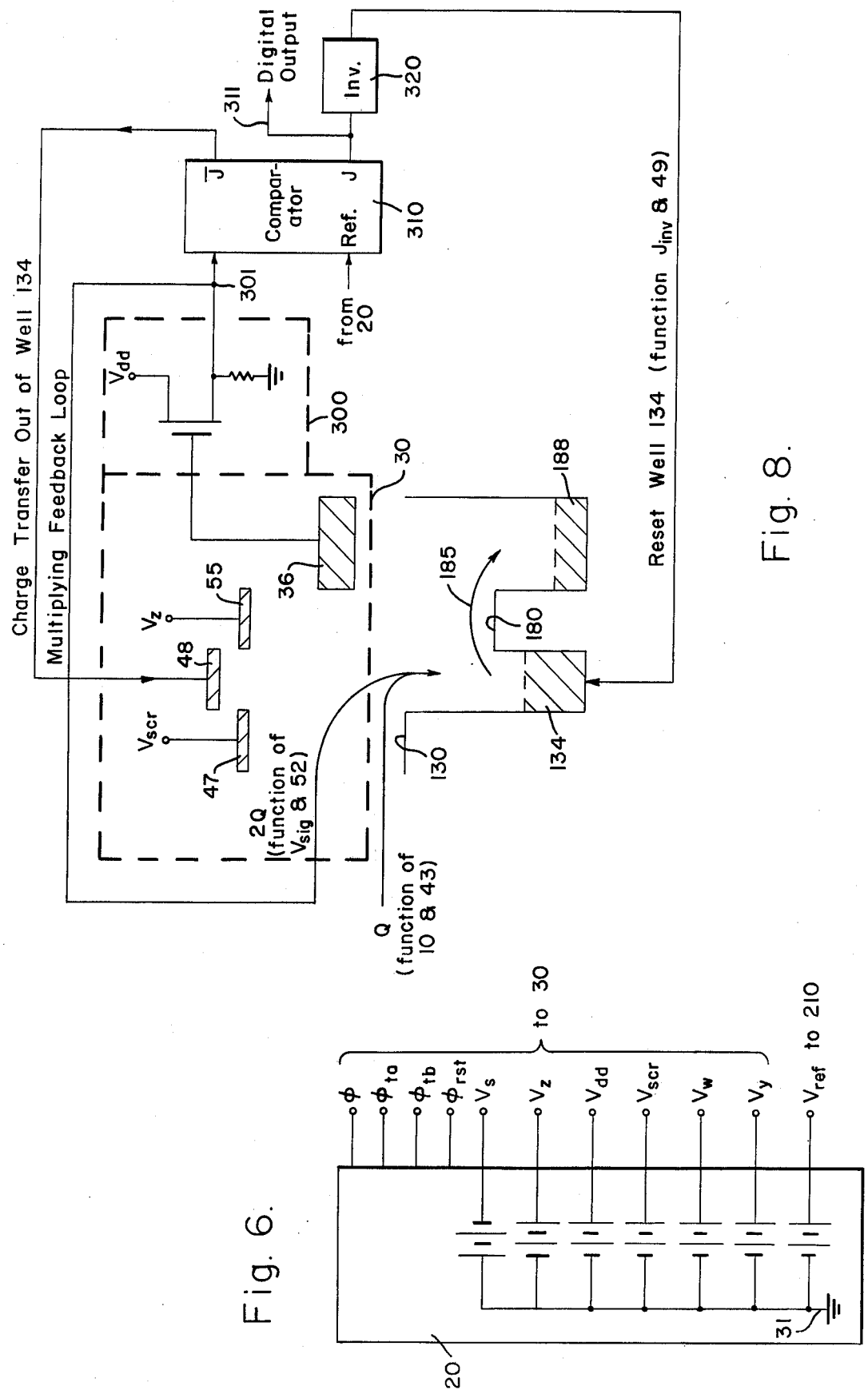

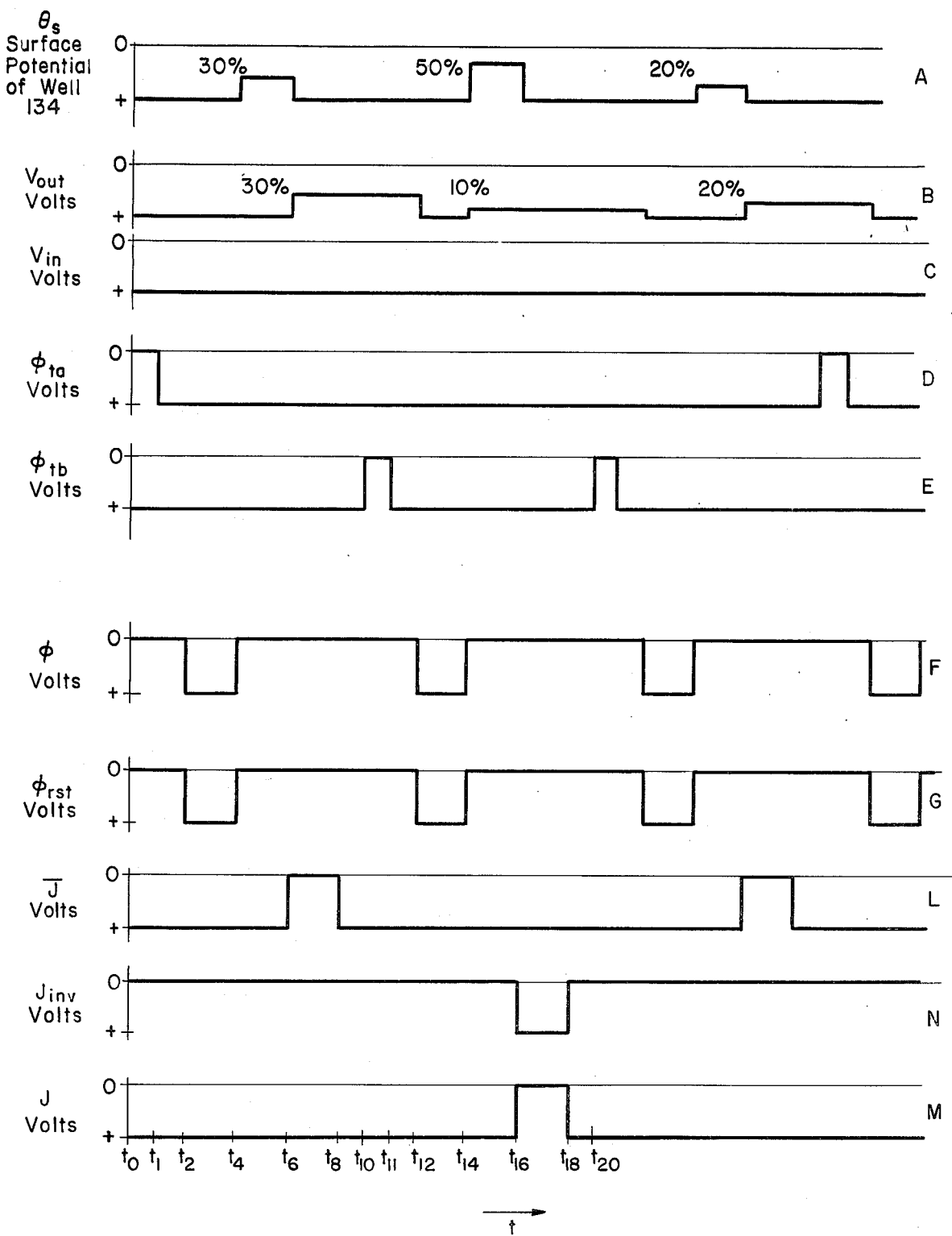

CHARGE TRANSFER MULTIPLYING FEEDBACK A/D CONVERTER

BACKGROUND OF THE INVENTION

This invention is in the field of analog to digital converters, and specifically in the field of such converters utilizing charge transfer or charge coupling techniques. It is also in the field of charge coupled devices utilizing signal feedback for multiplying charge quantities.

The prior art does not teach the use of charge coupled devices utilizing signal feedback for multiplying charge quantities.

The conventional prior art A/D converter does not use multiplying feedback principles to enable an increased input signal to be provided to the converter.

The prior art CCD A/D converter likewise does not use multiplying feedback to enable an increased charge level to be reinserted into the input of the converter. The failure to have an increased feedback input charge results in the inability to use a single reference input. The lack of use of a single reference input voltage results in an additional source for error in the A/D conversion process.

Hence, the lack of a CCD A/D multiplying feedback converter, results in a large electronic structure, large power consumption and extremely complex and error-prone control clocking circuits.

SUMMARY OF THE INVENTION

An objective of this invention is to provide an analog to digital converter utilizing CCD principles.

Another objective of this invention is to enable such a CCD A/D converter to provide twice the charge fed back at its input as was available at its output.

A further objective of the invention is to use CCD principles so as to provide a converter with very small geometries, reduced electrical power input and provide simple clocking circuits.

Accordingly, a charge transfer multiplying feedback A/D converter having a CCD structure is provided. Such CCD structure has a layer of semiconductor material and contiguous film of overlying electrically insulating material. An electrode connected to a DC voltage is embedded in the film, which establishes an electric potential barrier at the interface between the film and layer. Another electrode connected to another DC voltage is also embedded in the film and is charge-coupled to the first mentioned electrode. This other electrode with its DC voltage applied establishes another potential barrier at the interface. Both potential barriers provide the capability of establishing a potential well at the interface.

Still another electrode embedded in the film is energized by a clock signal which provides a potential well at the interface. This electrode is charge-coupled to the other two electrodes. All three electrodes and their respective voltages provide a charge flow over the first stated barrier into the potential well. Thus, a charge from the potential well can be transferred over the second mentioned barrier into a sense area of the device. Still another electrode embedded in the film is energized by another clock signal which enables the draining of charge from the well. A semiconductor diffusion is embedded in the layer which monitors charge inputs in terms of an output voltage from the CCD device. Still a further electrode embedded in the film is energized by the output voltage and thus enables a charge to be injected into the well, and in addition multiplies the charge output substantially twice in magnitude. Yet a further electrode embedded in the film is energized by an analog input signal to the device, for creating an input charge flowing over the first mentioned barrier into the well. A source follower is used so as to electrically buffer the device output to prevent loading of a voltage comparator connected to the source follower.

The voltage comparator which is driven by the source follower and a reference voltage, provides a digital equivalent output of analog input voltage to the device, and also provides a complementary signal of the digital equivalent. A logic inverter, coupled to the comparator, provides the second mentioned clock signal.

BRIEF DESCRIPTION OF THE DRAWINGS

FIG. 3a is a cross-section view taken at plane 3a—3a of FIG. 4. FIG. 3b is a cross-section view taken at plane 3b—3b of FIG. 5.

FIG. 6 is a block schematic showing the DC voltage sources and clock sources used in connection with the system.

FIG. 7 is a waveform graph showing the waveshapes and voltage and potential levels as found in the system.

FIG. 8 is a functional schematic addressed principally to the charge multiplying feedback path of the system.

DETAILED DESCRIPTION

Figure 1:
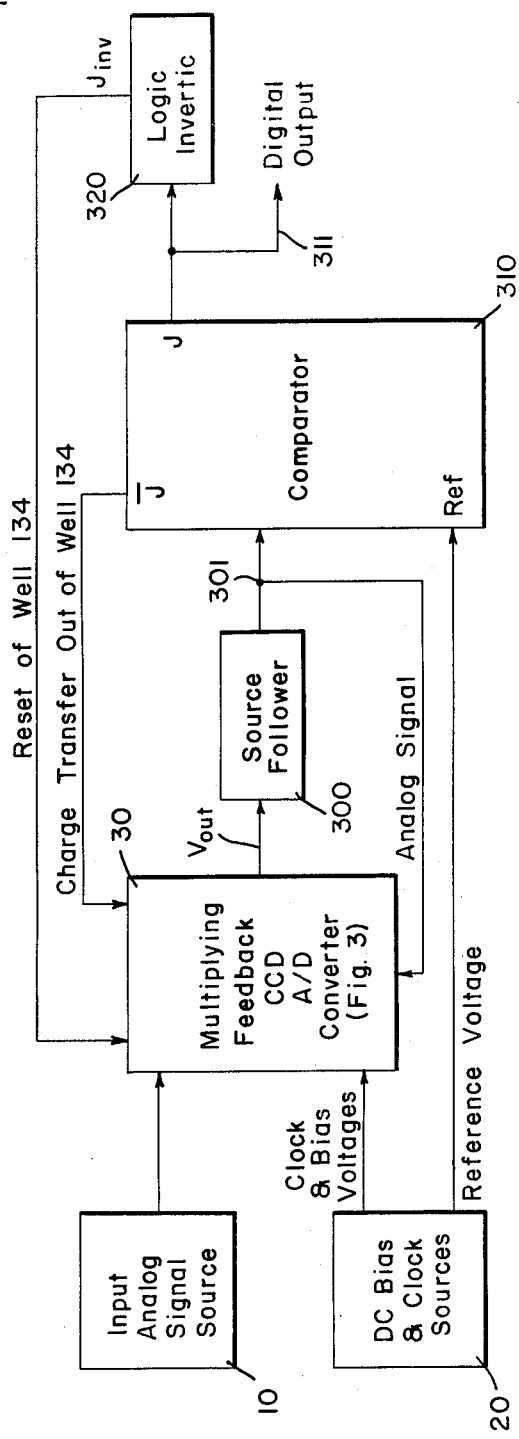
FIG. 1 is a schematic diagram of the A/D converter system in accordance with the invention.
Figure 2:
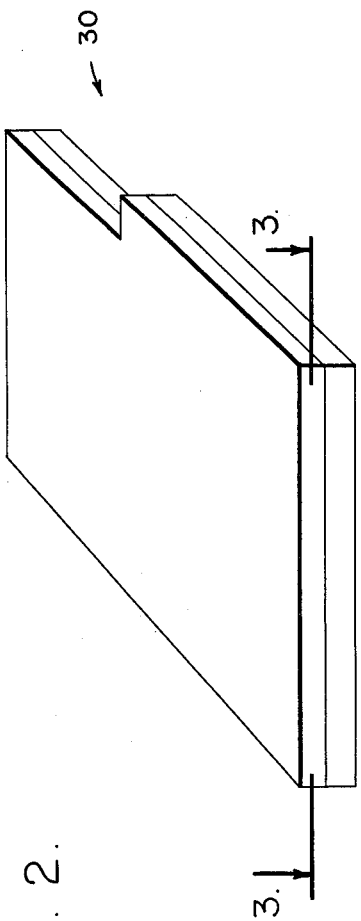
FIG. 2 is a perspective view of the multiplying feedback CCD chip which is part of the A/D system of FIG. 1.

Referring to FIGS. 1 and 6, a system utilizing the multiplying feedback CCD A/D converter 30 may be briefly described in terms of the signals feeding the converter and signal outputs from such converter.

Input analog signal source 10 provides an input to converter 30, and DC bias and clock source 20 provides a group of inputs to such converter, detailed hereinbelow.

Converter 30 provides an analog voltage output $V_{out}$ to source follower 300. Follower 300 provides at 301 an input to comparator 310 and also feedback to converter 30.

Bias and clock source 20 provides a reference voltage $V_{ref}$ to the reference input of comparator 310.

Comparator 310 has two output terminals at J and $\bar{J}$. Terminal $\bar{J}$ provides a charge transfer out of a well as an input to converter 30. Terminal J provides a digital output from the system, wherein such digital output is used to feed logic inverter 320. Inverter 320, based on digital output and J as an input thereto, provides an inverted form of the voltage output from J as an input to converter 30 for resetting such converter to its original state.

Referring to FIGS. 1, 2, 3, 4, 4a, 6 and 7, a charge transfer (sometimes referred to as charge coupled) device 30 is provided for converting an analog input thereto to binary or digital representation.

Device 30 has a semiconductor body 32 generally of silicon, however, other semiconductor materials such as germanium could be utilized as body 32. Body 32 is shown as a P+ conductivity doped silicon material, however, it is understood that other conductivity type materials, such as N type may be used.

Figure 4:
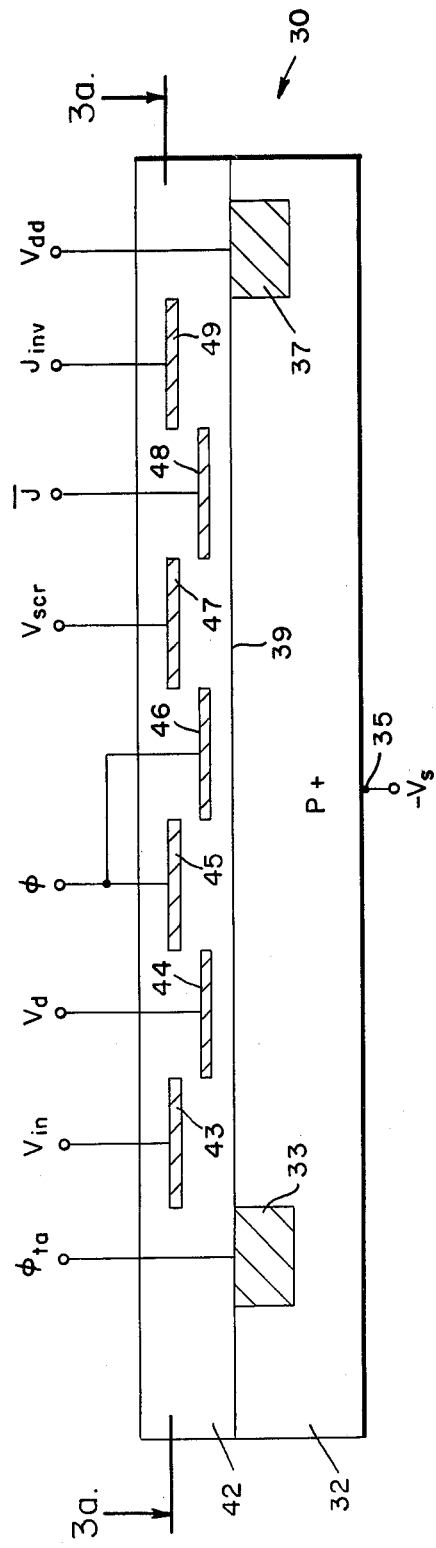
FIG. 4 is a cross-section view taken at plane 4—4 of FIG. 3.
Figure 4A:
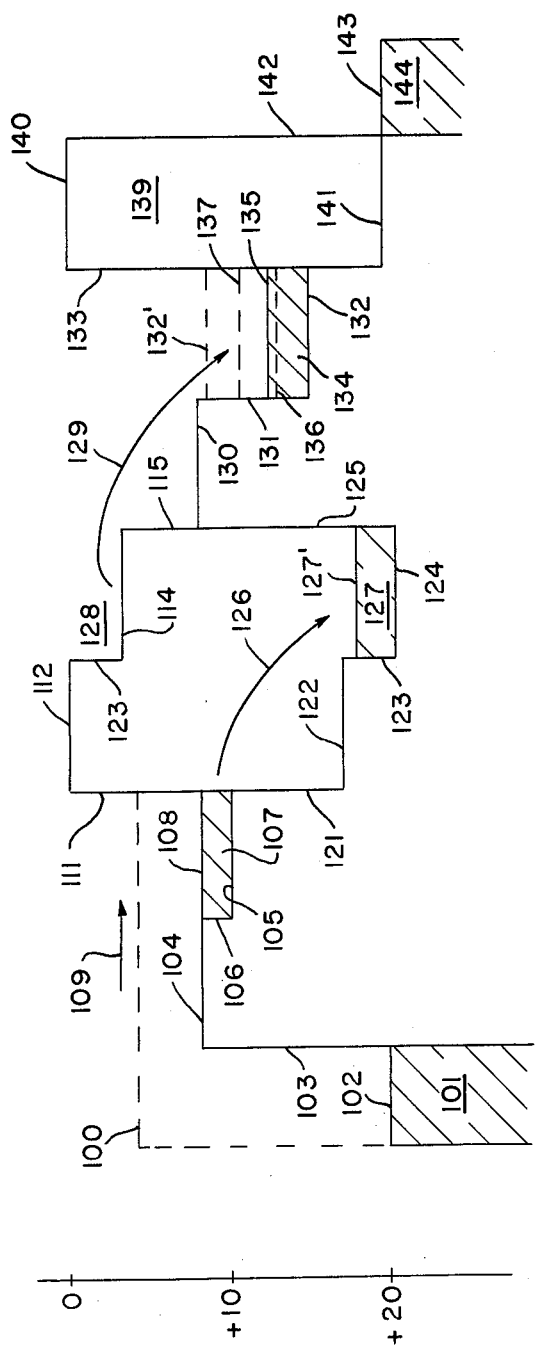
FIG. 4a is a potential profile of FIG. 4.

Electrodes 37 shown in FIG. 4 as partially embedded within body 32 is hard-wire interconnected and fed by DC potential $V_{dd}$ from power source 20 with respect to ground potential 31. As such, electrode 37 gives rise to potential charge area 144 having a surface potential ($\theta_s$) level 143 at semiconductor interface 39. It should be noted that potential area 144 is not a well because charge cannot be stored thereat since 144 area is essentially a charge drain or sink. This is also true for area 101.

Electrode 35 is connected to substrate semiconductor body 32 and is hard-wire connected at 35 to DC voltage $V_s$ of power source 20, with the positive side of battery $V_s$ being at ground potential and therefore providing a negative bias to substrate 32.

Electrode 33 is partially embedded within body 32 and is hard-wire connected to and fed by clock voltage source $\phi_{ta}$ of power source 20. Clock voltage $\phi_{ta}$ is indicated by waveform D in FIG. 7, and provides a periodic input charge into well 107. Clock $\phi_{ta}$ alternates between surface potential $\theta_s$ represented by levels 102 and 100.

An electrically insulating film 42, of SiO deposited over and on layer 32, forms an interface 39 with layer 32 and the upper surfaces of each of electrodes 33, 34, 36, 37 and 38. It is understood that other insulating films may be used.

Gate electrode 43 embedded in film 42 and is hard-wire connected to input signal $V_{in}$ from source 10 as indicated by waveform C, shown in FIG. 7, which gives rise to surface potential barrier 104 and corresponding walls 103 and 106.

Adjacent to electrode 43 is electrode 44, also embedded in film 42 and hard-wire connected and fed by DC potential $V_d$ with respect to ground potential 31, which electrode 44 and $V_d$ give rise to well 107 having a surface potential barrier 105 and corresponding walls 111 and 106.

Adjacent to electrode 44 are gate electrodes 45 and 46 which are embedded in film 42 and are hard-wire connected to clock voltage $\phi$ of source 20, represented by waveform F in FIG. 7. Electrodes 45 and 46 energized by clock $\phi$ give rise to potential barriers 112 and 114 and corresponding walls 111, 123 and 115, thereby creating charge area 128 when clock voltage $\phi$ is at PLUS volts, electrodes 45 and 46 give rise to potential levels 122 and 124 and corresponding walls 121, 123 and 125, thereby creating charge well 127.

Gate electrode 47 disposed adjacent to gate electrode 46 is embedded in film 42 and hard-wire connected to and fed by DC voltage $V_{scr}$ at 20 with respect to ground potential 31 which gives rise to surface potential barrier 130 and its corresponding walls 115, 125 and 131.

Located adjacent to electrode 47 is gate electrode 48 also embedded in film 42 and hard-wire connected to and fed by comparator 310 from its digital output signal terminal J wherein a typical waveform present at J is shown by waveform L. Normally J output has a positive voltage output giving rise to potential 132 and walls 131 and 133 and therefore creating charge well 134. When the output of the comparator at J has a logic ZERO output, a corresponding potential 132' is created, moving the bottom of well 134 to level 132'.

Gate electrode 49 is located adjacent to gate electrode 48 and is embedded in film 42 and hard-wire connected to and fed by logic inverter 320 at its output terminal, providing waveform $J_{inv}$ as shown as by waveform N.

Gate electrode 43, 45, 47 and 49 are substantially in one plane and are separated from each other. Gate electrodes 44, 46 and 48 are substantially in another plane, different from said one plane, and spaced from each other.

Figure 3:
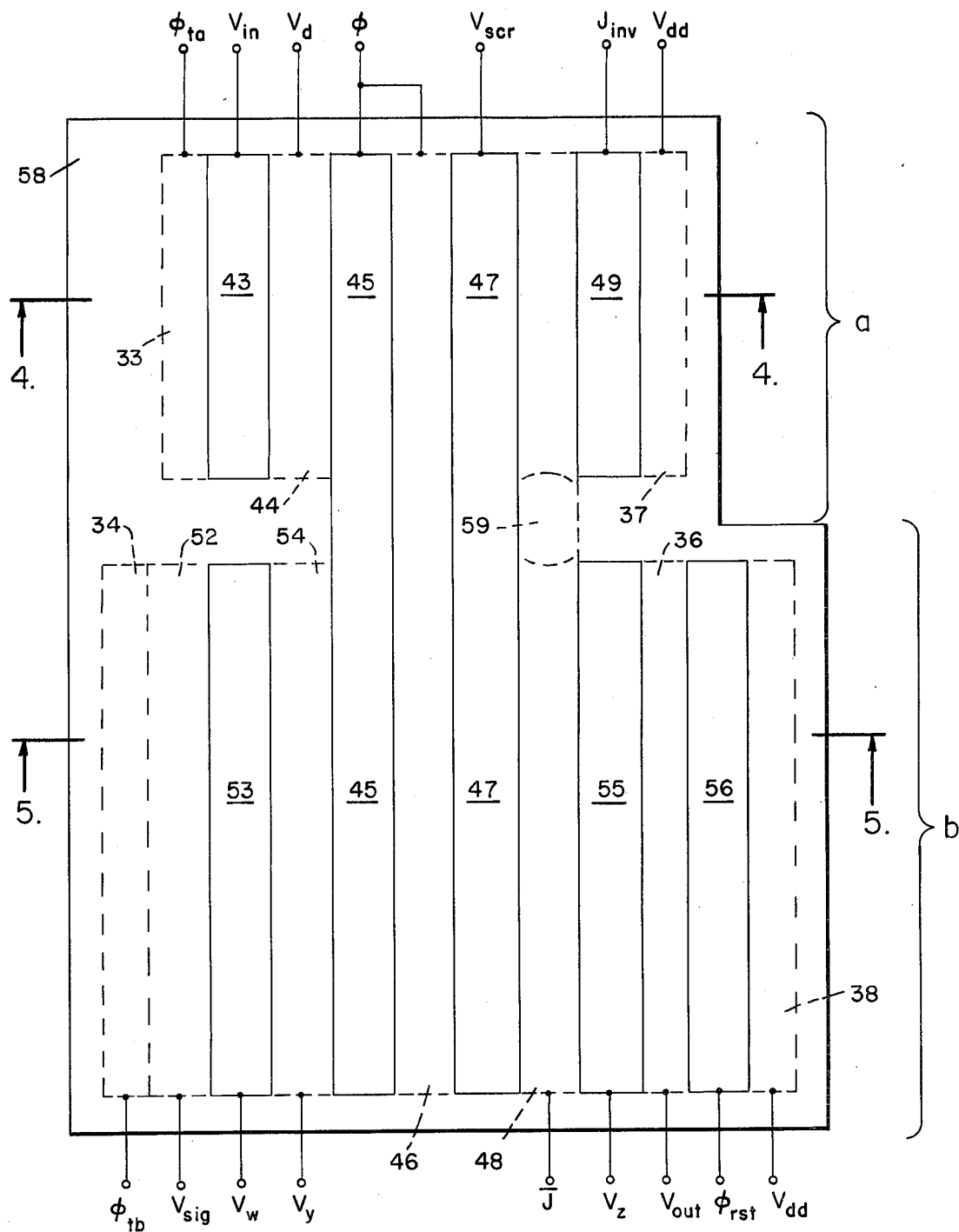
FIG. 3, consists of FIGS. 3a and 3b.
Figure 5:
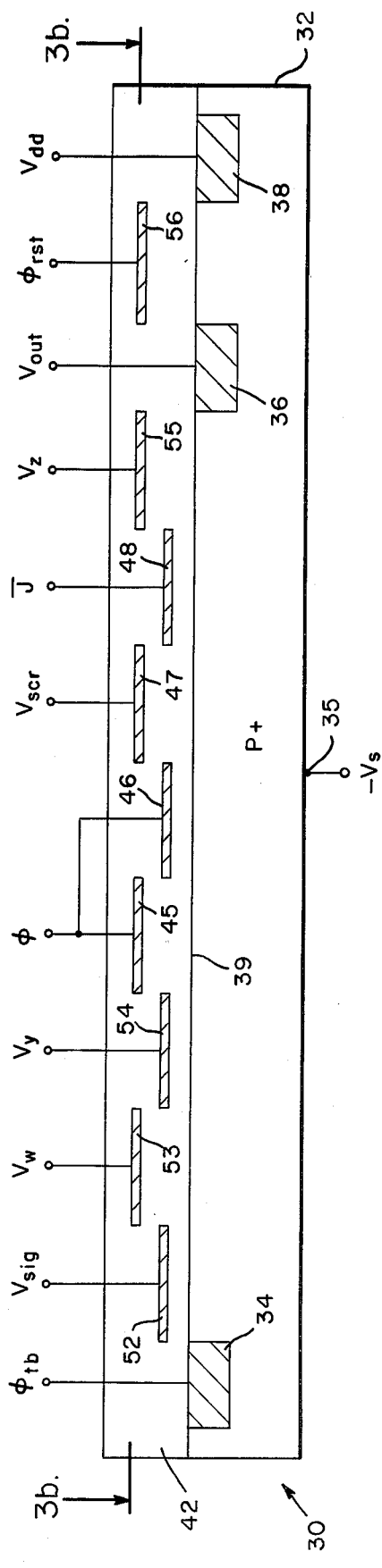
FIG. 5 is a cross-section view taken at plane 5—5 of FIG. 3.
Figure 5A:
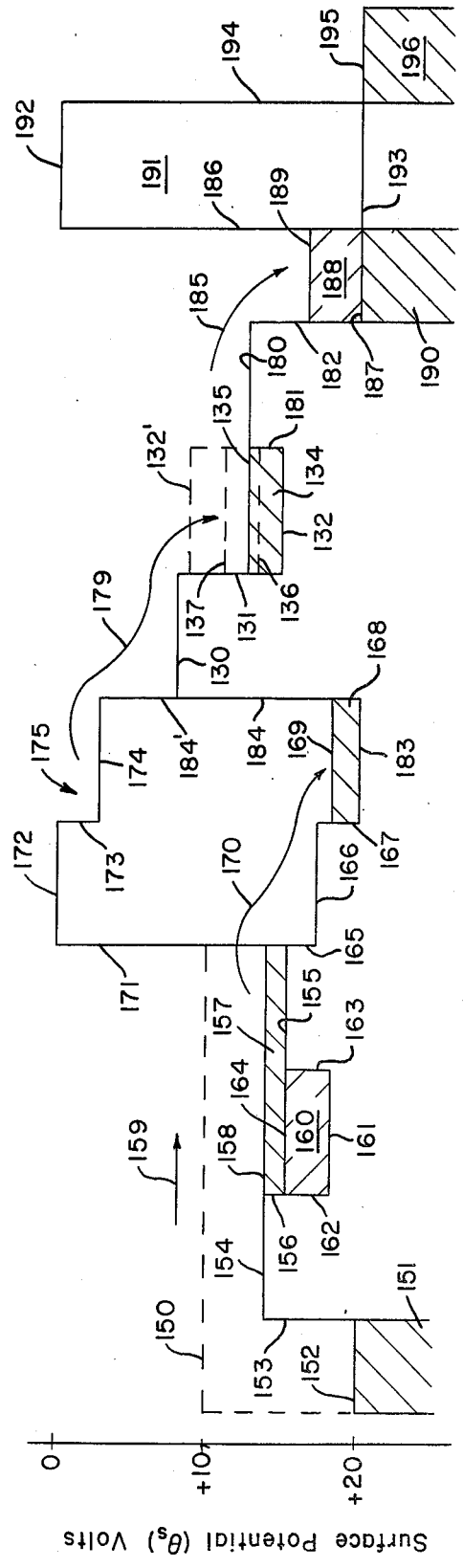
FIG. 5a is a potential profile of FIG. 5.

Referring specifically to FIGS. 3, 4 and 5, it should be noted that the CCD portion 300 of the A/D structure have several common gate electrodes, specifically gate electrodes 45, 46, 47 and 48. It should be further emphasized that only gate electrode 48 provides a common charge coupled path 59, as shown in FIG. 3., allowing charge to move transversely between electrode portion 48 of section 4—4 and electrode portion 48 of section 5—5, these sections being shown in FIG. 3, and cross-section thereof in FIGS. 4 and 5, respectively.

Gate electrodes 45, 46 and 47 at section 4—4 and 5—5 are separated by part of channel stop 58, so that charges in either section remain in their respective sections.

Referring to FIGS. 1, 3, 5, 5a, 6 and 7, where electrode 38 is partially embedded within body 32 and is hard-wire connected to and fed by DC voltage $V_{dd}$ from power source 20, giving rise to charge potential area 196, which area 196 has a surface potential level at 195 at interface 39. It should be noted that potential area 196 is not a well because charge cannot be stored thereat inasmuch as 196 area is essentially a charge drain or sink. This is also true for area 151.

Electrode 36, shown in FIG. 5 as partially embedded within body 32, provides an analog output $V_{out}$, and is hard-wire connected to the gate of source follower 300. The output $V_{out}$ thus provides a waveform B to the input of comparator 310. Electrode 36 senses the charge quantity of well 188 consisting of potential level 187, the surface potential of charge area 190 (being equal to potential 195) and walls 182 and 186.

Gate electrode 56, also embedded in film 42, is hard-wire connected to terminal $\phi_{rst}$ of power source 20. The voltage at $\phi_{rst}$ is illustrated as waveform G and consists of a series of rectangular pulses which provide a reset function to device 30, giving rise to surface potential barrier 192 and resulting in walls 186 and 194 when $\phi_{rst}$ is at ZERO volts and when surface potential 193 is at a PLUS level, thereby resetting output $V_{out}$ to $V_{dd}$ level prior to recycling the operation, after each serial bit computed by device 30.

Electrode 34 is partially embedded within body 32 and is hard-wire connected to and fed by power source 20, which electrode 34 is energized by a voltage having a clocked waveform E, giving rise to charge area 151 which is at surface potential level 152 when waveform E is positive and charge area 151 will be moved to level 150 when waveform E is at a lesser positive level than level 152.

Gate electrode 52, located adjacent to electrode 34 and embedded in film 42, is hard-wire connected to and fed by signal $V_{sig}$ at output 301 of source follower 300, giving rise to surface potential barrier 154 and corresponding walls 153, 156 and 162.

Gate electrode 53, adjacent to gate electrode 52 and also embedded in film 42, is hard-wire connected to and fed by DC voltage $V_w$ from power source 20, giving rise to potential level 161 and corresponding walls 156, 162 and 163 thus forming charge well 160.

Gate electrode 54, located adjacent to gate electrode 53 and embedded in film 42, is hard-wire connected to DC $V_y$ of power source 20, giving rise to potential level 155 and corresponding walls 163, 165 and 171, thus forming charge well 157.

Gate electrode 55, located adjacent to gate electrode 48 and diffusion 36 is embedded in film 42 and is hard-wire connected to and fed by DC voltage $V_z$ of power source 20, giving rise to potential level barrier 180 and its corresponding walls 181 and 182.

Adjacent to gate electrode 54 are gate electrodes 45 and 46, which electrodes 45 and 46 are embedded in film 42 and are hard-wire connected to clock voltage source $\phi$ of power source 20. As previously mentioned, clock source $\phi$ is represented by waveform F which is applied to electrodes 45 and 46, giving rise to potential barriers 172 and 174 and their corresponding walls 171, 173 and 184', thereby creating charge area 175 when the voltage of clock $\phi$ is ZERO. When clock voltage $\phi$ is POSITIVE, potential levels 166 and 183 are created along with corresponding walls 165, 167 and 184 thereby creating charge well 185.

Adjacent to gate electrode 46 is gate electrode 47 embedded in film 42, wherein electrode 47 is hard-wire connected to and fed by DC voltage $V_{scr}$ of source 20, giving rise to surface potential barrier 130 and its corresponding walls 184', 184 and 131.

Located between electrodes 47 and 55 is gate electrode 48 also embedded in film 42 and hard-wire connected to and fed by comparator 310 at its digital output signal terminal $\bar{J}$, wherein a typical waveform of $\bar{J}$ is shown by waveform L. Normally $\bar{J}$ output is at a positive voltage level, giving rise to potential 132 and walls 131 and 181 thereby creating charge well 134. When the $\bar{J}$ is at ZERO volts, a corresponding potential level 132' is created at interface 39 thus moving the bottom of well 134 to level 132'.

Electrodes 53, 45, 47, 55 and 56 are in substantially one plane and separated from each other. Electrodes 52, 54, 46 and 48 are substantially in another plane, different from said one plane and spaced from each other.

Figure 9:
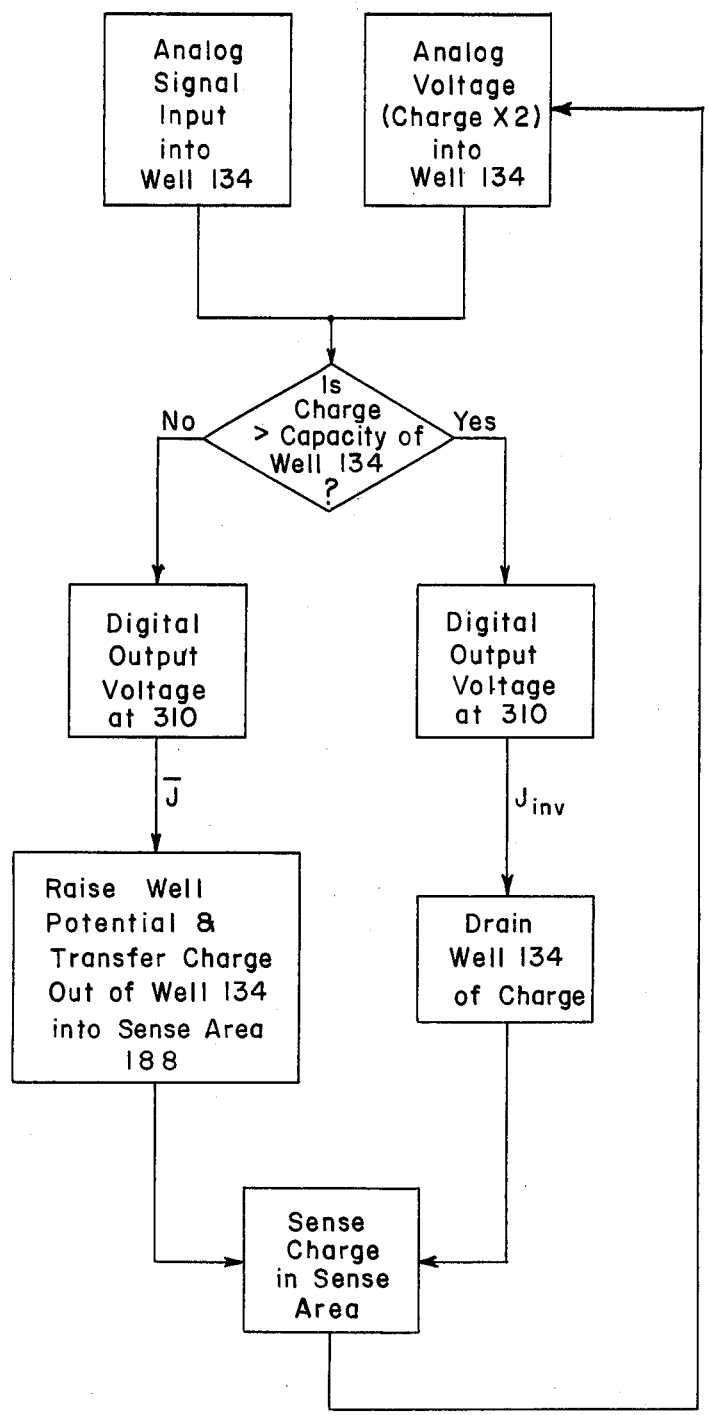
FIG. 9 is an algorithm showing the principal functions of the converter.

Referring to FIGS. 1, 8 and 9, the functional operation of the A/D system is described. The converter converts an analog input voltage into binary digital representations thereof, in a serial manner, that is, it computes the most significant bit, the second most significant bit and so on, and finally the least significant bit.

An analog input signal voltage $V_{in}$ from source 10 which is first applied to electrode 43 (see FIG. 4), results in a charge which ultimately is transferred into well 134. Well 134 has a 50 percent charge capacity of the full charge capacity of the converter. The full charge capacity of the converter is analogous to a full voltage range of the converter in accordance with input voltage $V_{in}$.

If the charge in well 134 is less than its charge capacity then no charge will flow over barrier 180.

Comparator 310 computes a logic ZERO and provides same at its J output terminal thereby also providing a logic ONE output at its $\bar{J}$ terminal, forcing the charge quantity in well 134 of less than its charge capacity to be transferred over barrier 180 as shown by arrow 185 into well 188. The charge just transferred over into sense area 188 will be sensed as a voltage at output 301 of source follower 300. Such voltage as appearing at 301 will have an analog signal voltage format.

Such analog signal voltage is now converted to a charge which in quantity will be twice the charge residing in area 188. Thus, an analog voltage at 301 will be fed back as a $V_{sig}$ input into CCD 30, creating a new charge twice in magnitude of the charge in area 188.

The entire process of injecting charge into device 30 and the feedback cycle just described will be repeated for computing subsequent output bits.

If the charge in well 134 is still less than the charge capacity of well 134, the process is repeated as described providing output logic ZEROS until the feedback charge is greater than the charge capacity of well 134.

If the charge which had just been transferred over barrier 130 into well 134 is greater than the charge capacity of well 134, charge will flow over barrier 180 as shown by arrow 185 into sense area 188, indicating that well 134 is now filled with charge, and also indicating that the magnitude of the charge in excess of the capacity of well 134 which will now appear in sense area 188. Such excess charge is now sensed diffusion 36 and seen as a voltage output from source follower 300 at 301, providing the feedback voltage at 301 as already discussed, and is also fed to comparator 310 to compute a logic ONE and provides such logic ONE digital output at terminal J and 311. The output J is fed through inverter 320 to terminal $J_{inv}$ of device 30 to reset well 134 so that it has ZERO charge therein.

Referring to FIGS. 1, 3, 4, 4a, 5, 5a, 6, 7 and 8 further detail is presented of the above stated operation of the CCD A/D converter.

At time $t_o$ voltage source 10 provides an analog input signal $V_{in}$ to gate 43, of such voltage level so as to provide a charge which is 30 percent of the charge capacity of the converter. $V_{in}$ is shown as waveform C.

Also at time $t_o$, waveform D provides clock signal voltage $\phi_{ta}$ to electrode 33. As a result, a transition occurs for charge 101 from level 102 of such charge to level 100 providing a means for filling well 107 with charge in accordance with charge flow arrow 109.

At time $t_1$ waveform D makes the transition from level 100 to level 102, leaving a charge in well 107 at level 108, which charge in well 107 is proportional to $V_{in}$.

At time $t_2$, waveform F makes the transition from ZERO to PLUS voltage thereby shifting surface potentials $\theta_s$ at interface 39 under gates 45 and 46 from levels 112 and 114 to levels 122 and 124, respectively. Charge in well 107 will flow over barrier 122 into well 127 as shown by arrow 126.

At time $t_4$, waveform F makes a transition from PLUS to ZERO voltage thereby shifting surface potentials $\theta_s$ of gates 45 and 46 from levels 122 and 124 to levels 112 and 114, respectively. Therefore, elevating charge well 127 with surface potential 127' to area 128 and hence transferring the charge over barrier 130 and into well 134 as indicated by charge direction flow arrow 129. Well 134, having a charge capacity above defined will contain charge up to such capacity without spilling over barrier 180. Hence, well 134 fills with charge to level 136, which charge corresponds to a surface potential of 30 percent of the maximum value of $V_{in}$ as shown in waveform A. Since no charge flows over barrier 180 into output sense area 188, voltage $V_{out}$ does not change and remains at level 187 which is equal to the reset level of well 188. Such non-change is evident from waveform B at $t_4$–$t_6$.

During time $t_4$–$t_6$, source follower 300 provides a voltage at 301 to comparator 310. Power source 20 provides a DC reference voltage $V_{ref}$ to comparator 310 input. Since the source follower output voltage is more positive than the reference voltage (no charge in 188 output sense area), the comparator computes a logic ZERO at the J output terminal, as shown by waveform M at $t_6$.

Simultaneously, and at $t_6$, the comparator provides a logic ONE signal at the J̄ output, as indicated by waveform L, thereby creating a transfer command to well 134 by virtue of energizing gate 48, wherein potential 132 creates the bottom of well 134, and such potential 132 makes a transition to level 132'. Therefore the charge in well 134 transfers over barrier 180, in accordance with charge direction flow arrow 185, into output charge sense area 188, filling sense area 188 to level 189 and creating output voltage at $V_{out}$ waveform B. $V_{out}$ is buffered, as before described, by source follower 300, providing an analog voltage at 301, which action supplies a signal to comparator 310 and an input voltage at $V_{sig}$ to gate 52, represented by 2Q.

At $t_8$ comparator output J̄ is reset to a PLUS level as shown by waveform L.

It should be noted that logic ZERO at either of the comparator output terminals and at $J_{inv}$ output of inverter 320, is defined by a POSITIVE voltage output, and logic ONE is defined by a ZERO voltage output.

It should be noted that sampling clock voltage $\phi_{ta}$ shown by waveform D, only occurs once, allowing sampling of the input voltage for each A/D conversion. The $\phi_{ta}$ voltage pulse may also be considered as a start-to-convert command. Clocking signal $\phi_{tb}$ conversely does not change logic states during $t_0$–$t_1$, the period during which the most significant bit computation is started. Therefore, at time $t_{10}$, $\phi_{tb}$ starts the next less significant bit computation as seen in waveform E, and $\phi_{tb}$ makes a transition from POSITIVE to ZERO voltage, providing a charge supply by moving level 152 to level 150 and allowing charge to flow from charge source 151 over barrier 154 into well 157 in accordance with charge flow arrow 159. It should be noted that charge in area or well 160, below level 164, remains in well 160 and does not contribute any charge to the change created by the modulator as defined below. The purpose of well 157 is to provide a well, over well 160, which will provide an enlarged surface area so that the modulating voltage $V_{sig}$ will create a charge twice that of the charge within output sense area 188. A modulator is created by virture of interaction between electrodes 52, 53, 54 and 34 wherein the voltage at 301 generated by charge Q. Charge Q is converted by the modulator to a charge 2Q consisting of the total charge in well 157.

At time $t_{11}$, waveform E makes a positive transition from level 150 to level 152 leaving charge in well 157 at level 153. Charge 157 has twice the magnitude of the charge in charge output sense area 188.

At time $t_{12}$, waveform G makes a transition from a ZERO to a PLUS voltage, shifting barrier 191 from level 192 to level 193, allowing output charge sense area 188 to be reset from level 189 to level 187. Waveform B indicates the voltage output $V_{out}$ due to such resetting.

Simultaneously at time $t_{12}$, clock $\phi$, shown as waveform F, makes a transition from a ZERO to PLUS voltage shifting potentials 172 and 174 to level 166 and 183, respectively, thus allowing charge in well 157 to be transferred over barrier 166 into well 168 as indicated by charge direction flow arrow 170 thus filling well 168 to level 169.

At time $t_{14}$, clock voltage $\phi_{rst}$ as shown in waveform G makes a transition from PLUS to ZERO voltage thereby shifting the potential level of barrier 191 from level 193 to level 192.

At time $t_{14}$, waveform F makes a transition from PLUS to ZERO voltage shifting potential levels 166 and 183 to levels 172 and 174, respectively. The charge in well 168 is therefore moved from level 183 to level 174. Charge transfers out of area 175 and flows over barrier 130 and into well 134 as indicated by charge direction flow arrow 179. Now the charge in well 134 corresponds to 60 percent of the maximum value of $V_{in}$ which momentarily fills well 134 to level 137. Inasmuch as well 134 only has a 50 percent capacity, 10 percent of such charge will flow over barrier 180 into output sense area 188 as shown by arrow 185.

An output voltage $V_{out}$ shown by waveform B, is proportional to the 10 percent charge in sense area 188. Electrode 36, used to sense such charge, enables an analog voltage to be present at the output of the source follower at 301. The source follower output is now compared by comparator 310 with the reference voltage $V_{ref}$, yielding a digital output at terminal J of logic state ONE in relation to the PLUS at ZERO volts transition at time $t_{16}$. Such transition is shown by waveform M.

Remembering that a 50 percent filled well 134 represents a digital ONE output at J, such logic ONE is used to feed inverter 320 so that inverter 320 provides a $J_{inv}$, an inverted form of J, used to reset well 134. Such resetting is accomplished by virture of the transition at time $t_{16}$ of waveform N from its ZERO to POSITIVE voltage state. This is effected because such transition causes the potential level of barrier 139 to shift from level 140 to level 141. Well 134 is now reset or emptied of charge in that charge in well 134, at level 135, flows out of well 134 and over barrier level 141 into charge sink area 144 at level of which is at 143. Such transition is indicated by waveform A.

At time $t_{18}$, the output at J of comparator 310 is reset to a positive voltage level as shown by waveform M. Simultaneously, logic inverter 320 creates a $J_{inv}$ signal, shown by waveform N, which waveform N makes a transition from a POSITIVE to a ZERO voltage level so as to bring potential 141 of barrier 139 to level 140.

The A/D converter is now ready to compute the next least significant digital bit starting at time $t_{20}$.

What is claimed is:

1. An analog to digital converter comprising, in combination:

primary charge storage means having a charge storage capacity substantially corresponding to one-half of the full scale value of said converter;

means for periodically creating a charge indicative of the instantaneous value of an analog input signal in an initial charge storage area and including additional means for applying said charge to said primary charge storage means;

secondary charge storage means coupled to said primary charge storage means for temporarily storing excess charges which overflow said primary charge storage means and storing charges which are transferred from said primary charge storage means;

sensing means for sensing the amount of charge stored in said secondary charge storage means, and including further means for periodically creating an amount of charge which is proportional to twice said sensed charge, said further means including said additional means for applying the charge which is proportional to twice the sensed charge to said primary charge storage means;

barrier level changing means for draining the charge stored in said secondary charge storage means;

comparator means coupled to said sensing means for periodically determining whether or not the charge applied to said primary charge storage means exceeds its charge storage capacity and for providing a binary output signal indicative thereof; and means responsive to said binary output signal for draining the charge in said primary charge storage means when overflow charges are sensed and for transferring the charge stored in said primary charge storage means to said secondary charge storage means when a overflow charge is not sensed;

whereby said binary output signals are indicative of the value of the applied analog input signal.

2. The invention as stated in claim 1, wherein the sensing means provides a feedback path between its output and the primary charge storage means for providing charge flow into said primary charge storage means.

3. The invention as stated in claim 1, wherein the comparator means provides a logic ZERO digital output when the charge quantity in said well is at a first level in the well up to said one-half of the full scale value of the converter and a logic ONE digital output when the charge in said well is at a second level higher than the first level.

4. An analog to digital converter for providing a series of binary signals which are indicative of the value of an applied analog input signal, said converter comprising;

a semiconductor substrate;

first means for forming in said semiconductor substrate a charge well having a charge storage capacity corresponding to one-half of the full scale value of said converter;

second means for applying charge indicative of the applied analog input signal to said charge well;

third means for temporarily storing and for sensing the quantity of charge in a sense area for excess charges which overflow said charge well or charges which are transferred from said charge well;

fourth means for periodically creating an amount of charge which is proportionate to twice said sensed charge and including added means for applying the created charge to said charge well, and further means for the draining the charge stored in said sensed area;

fifth means which includes said third means for periodically sensing whether or not the charges applied to said charge well are in excess of the charge storage capacity of said well and for providing binary output signals indicative thereof; and sixth means responsive to said binary output signals for draining the charges in said charge well when overflow charges are sensed and including still further means for transferring the charges stored in said charge well to said sense area when overflow charges are not sensed;

whereby said binary output signals from said fifth means are indicative of the value of the applied analog input signal.

5. The invention as stated in claim 4, including multiplying feedback means coupled to third means, for multiplying the transferred charges of the sense area and for providing a signal feedback path to the well so as to feed the multiplied charges into said well.

6. The invention as stated in claim 5, wherein the charges which are less than the charge capacity of the well are converted into a signal having a value proportional to twice the multiplied charge so as to provide the well with a charge twice the sensed charge.

7. The invention as stated in claim 5, wherein said means for comparing provides a logic ZERO digital output when the charge quantity in said well is at a first level in the well up to said one-half its charge capacity and a logic ONE digital output when the charge in said well is at a second level higher than the first level.

8. A method for providing analog to digital conversion utilizing a multiplying feedback CCD A/D device, comprising the steps of:

(a) creating a first electric potential barrier at the interface between an electrically insulating film and an overlying semiconductive layer;

(b) creating a second potential barrier thereby providing the capability for establishing a potential well at said interface between said barriers;

(c) feeding a first clock signal to a first electrode thereby establishing said potential well between said barriers;

(d) injecting a first charge into said well over said first potential barrier, said first charge being an analog input signal charge;

(e) transferring charge from said well into an output sense area;

(f) sensing said transferred charge in terms of an output voltage from said device;

(g) buffering the output voltage of step (f); and (h) supplying a second charge to said well by feeding back the buffered output voltage to a second electrode within the film.

9. The invention as stated in claim 8, including the further step of:

(i) comparing the output voltage of step (g) with a reference voltage and feeding the compared voltage to said first electrode so as to transfer any charge residual in said well out from said well to said sense area as identified in step (e).

10. The invention as stated in claim 8, including the further step of:

(j) comparing the output voltage of step (g) with a reference voltage and inverting the compared voltage for resetting said well so that it is devoid of charge.

11. The invention as stated in claim 8, including the step of:

(k) comparing the output voltage of step (g) with a reference voltage and providing a digital output of an analog input signal.

* * * * *